United States Patent
Kashmiri et al.

(10) Patent No.: US 8,222,940 B2
(45) Date of Patent: Jul. 17, 2012

(54) ELECTROTHERMAL FREQUENCY REFERENCE

(75) Inventors: Sayyed Mahdi Kashmiri, Delft (NL); Kofi A. A. Makinwa, Delft (NL)

(73) Assignee: Stichting voor de Technische Wetenschappen, Utrecht (NL)

( * ) Notice: Subject to any disclaimer, the term of this patent is extended or adjusted under 35 U.S.C. 154(b) by 0 days.

(21) Appl. No.: 12/931,185

(22) Filed: Jan. 26, 2011

(65) Prior Publication Data
US 2011/0187428 A1 Aug. 4, 2011

Related U.S. Application Data

(60) Provisional application No. 61/336,994, filed on Jan. 30, 2010.

(51) Int. Cl.
H03L 7/06 (2006.01)
(52) U.S. Cl. .................. 327/159; 327/150; 327/262
(58) Field of Classification Search .............. 327/150, 327/159, 262
See application file for complete search history.

(56) References Cited

U.S. PATENT DOCUMENTS

| | | | | |
|---|---|---|---|---|
| 4,520,320 | A | 5/1985 | Potzick et al. | 327/7 |
| 5,713,665 | A | 2/1998 | Kato et al. | 374/43 |
| 6,121,848 | A * | 9/2000 | Sauer | 331/108 C |
| 6,208,215 | B1 * | 3/2001 | Sauer | 331/108 C |
| 7,920,032 | B2 * | 4/2011 | Makinwa et al. | 331/176 |
| 2007/0190952 | A1 * | 8/2007 | Waheed et al. | 455/114.3 |
| 2008/0205571 | A1 * | 8/2008 | Muhammad et al. | 375/376 |
| 2009/0212875 | A1 * | 8/2009 | Makinwa et al. | 331/34 |
| 2009/0261917 | A1 * | 10/2009 | Taghivand et al. | 331/36 C |
| 2009/0273402 | A1 * | 11/2009 | Ruffieux | 331/25 |
| 2011/0090003 | A1 * | 4/2011 | Wang et al. | 327/544 |
| 2011/0187428 | A1 * | 8/2011 | Kashmiri et al. | 327/159 |

FOREIGN PATENT DOCUMENTS

| WO | WO 2006/132531 | 12/2006 |
|---|---|---|
| WO | WO 2009/096787 | 8/2009 |

OTHER PUBLICATIONS

PCT Search Report and Written Opinion, Apr. 18, 2011.
V. Szekely et al., "Test structure for thermal monitoring", in *Proc. 1996 IEEE Int. Conf. on Microelectronic Test Structures*, vol. 9, Mar. 1996, pp. 111-115.

(Continued)

*Primary Examiner* — Lincoln Donovan
*Assistant Examiner* — Adam Houston
(74) *Attorney, Agent, or Firm* — Steven E. Stupp

(57) ABSTRACT

An electrothermal frequency-locked loop (EFLL) circuit is described. This EFLL circuit includes an oscillator in a feedback loop. A drive circuit in the EFLL circuit generates a first signal having a fundamental frequency, and an electrothermal filter (ETF) in the EFLL circuit provides a second signal based on the first signal. This second signal has the fundamental frequency and a phase (relative to the first signal) that corresponds to a temperature-dependent time constant of the ETF. Moreover, a sensing component in the EFLL circuit determines a parameter associated with a temperature of the ETF. For example, the parameter may be the temperature or may be other than the temperature, such as the fundamental frequency and/or the phase of the second signal. Furthermore, the EFLL circuit includes a compensation circuit that compensates for frequency changes associated with changes in the temperature based at least on the parameter so that the fundamental frequency is approximately independent of the temperature.

20 Claims, 11 Drawing Sheets

OTHER PUBLICATIONS

M.A.P. Pertijs, K.A.A. Makinwa and J.H. Huijsing, "A CMOS temperature sensor with a 3σ inaccuracy of ±0.1° C from −55° C to 125° C," *Digest of Technical Papers ISSCC*, pp. 238-596, Feb. 2005.

K.A.A. Makinwa and M.F. Snoeij, "CMOS Temperature-to-Frequency Converter with an Inaccuracy of +0.5C (3c) from --40 to 105C," *J. Solid-State Circuits*, vol. 41, is. 12, pp. 2992-2997, Dec. 2006.

"Advances in Silicon Technology Enables Replacement of Quartz-Based Oscillators," Silicon Laboratories, White Paper, Sep. 2008.

M. Kashmiri, S. Xia and K.A.A. Makinwa, "A Temperature-to-Digital Converter Based on an Optimized Electrothermal Filter," *J. Solid-State Circuits*, vol. 44, is. 7, pp. 2026-2035, Jul. 2009.

S.M. Kashmiri, K. A. A. Makinwa, "A Digitally-Assisted Electrothermal Frequency Locked Loop," *Proc. of ESSCIRC*, Sep. 2009, pp. 296-299.

S.M. Kashmiri et al., Measuring the Thermal Diffusivity of CMOS Chips, *IEEE Sensors*, Oct. 2009, pp. 45-48.

K. Souri, M. Kashmiri and K.A.A. Makinwa, "A CMOS Temperature Sensor with an Energy-Efficient Zoom ADC and an Inaccuracy of ±0.25° C (3σ) from −40 to 125° C," *Digest ISSCC*, pp. 310-311, Feb. 2010.

S. M. Kashmiri, M.A.P. Pertijs and K.A.A. Makinwa, "A Thermal-Diffusivity-Based Frequency Reference in Standard CMOS with an Absolute Inaccuracy of ±0.1% from −55 to 125° C," *J. Solid-State Circuits*, vol. 45, is. 12, pp. 2510-2520, Dec. 2010.

\* cited by examiner

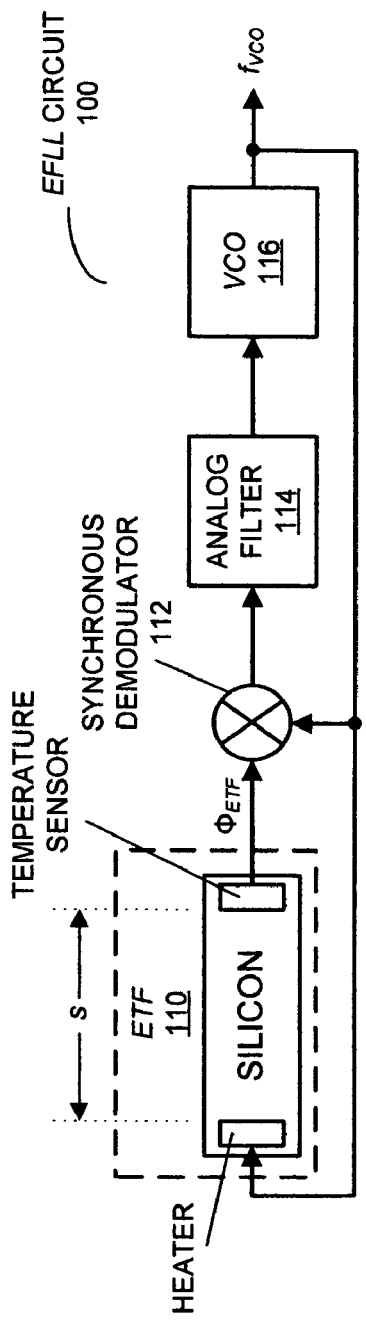
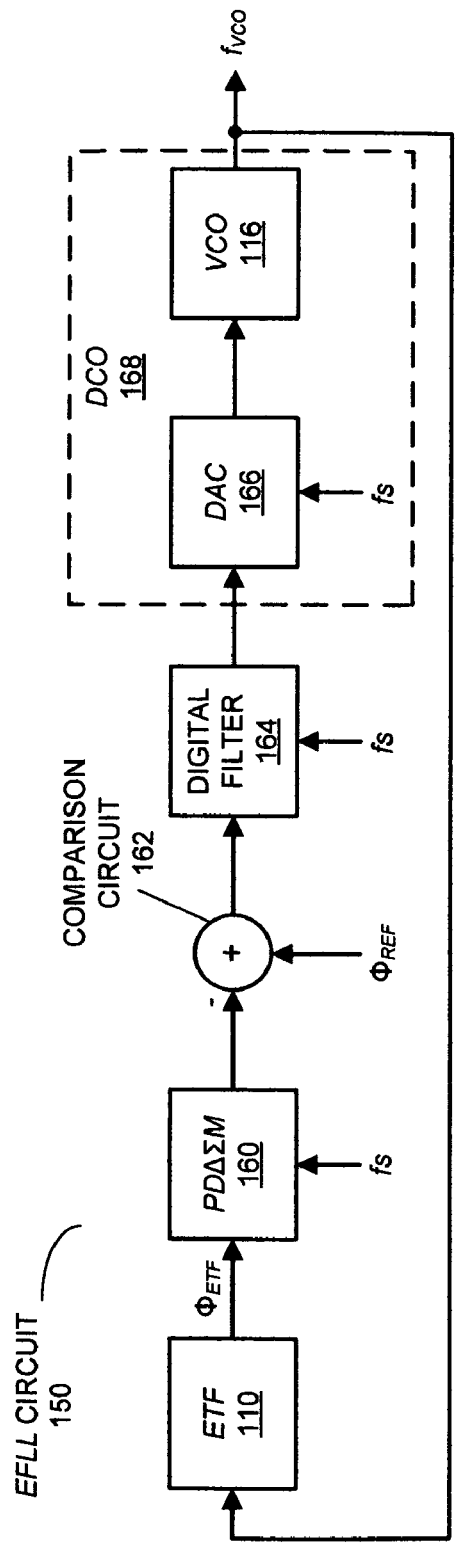
FIG. 1A
FIG. 1B

ELECTROTHERMAL FREQUENCY REFERENCE

CROSS REFERENCE TO RELATED APPLICATIONS

This application claims priority under 35 U.S.C. 119(e) to U.S. Provisional Application Ser. No. 61/336,994, entitled "Electrothermal Frequency Reference," by Sayyed M. Kashmiri et al., filed on Jan. 30, 2010, the contents of which are herein incorporated by reference.

FIELD OF THE INVENTION

The present disclosure relates generally to a circuit, and related methods, that provide a frequency reference using an electrothermal frequency reference.

BACKGROUND

Many electronic devices include one or more frequency references. When implemented using external components, these frequency references can increase the cost, size and complexity of an electronic device. Consequently, significant research has been devoted to implement frequency references on-chip using standard complementary metal oxide semiconductor (CMOS) technology. However, the accuracy of such on-chip frequency references is often limited by the process spread and temperature drift of on-chip electrical components.

Therefore, there is a need for an on-chip frequency reference without the problems listed above.

SUMMARY OF THE INVENTION

One embodiment of the present disclosure provides an electrothermal frequency-locked loop (EFLL) circuit. This EFLL circuit includes an oscillator in a feedback loop. In particular, a first signal having a fundamental frequency, which is generated by a drive circuit, drives an electrothermal filter (ETF). In response, the ETF provides a second signal based on the first signal. This second signal has the fundamental frequency (which is defined by the first signal) and a phase (relative to the first signal) that corresponds to a temperature-dependent time constant of the ETF. The drive circuit may monitor the phase and adjust the first signal so that the phase of the second signal is maintained at a predetermined phase set-point, thereby locking the fundamental frequency to the thermal time constant of the ETF. Note that the phase set point of the EFLL circuit may be adjustable. For example, the phase set point of the EFLL circuit may be continuously adjustable.

In addition, a sensing component in the EFLL circuit may determine a parameter associated with a temperature of the ETF. Based on the determined parameter, a compensation circuit in the EFLL circuit may compensate for frequency changes associated with changes in the temperature of the ETF so that the fundamental frequency is approximately independent of the temperature.

For example, the compensation circuit may adjust the phase set-point in a temperature-dependent manner. Alternatively or additionally, the compensation circuit may alter the physical dimensions or thermal properties of the ETF in a temperature-dependent manner.

In some embodiments, the sensing component includes a temperature sensor that is thermally coupled to the ETF. Note that the temperature sensor may be based upon a different physical phenomenon than the ETF, e.g., the well-defined temperature dependence of bipolar transistors.

Furthermore, the sensing component may employ differential measurements involving at least one other ETF. For example, the EFLL circuit may include a second ETF, where the ETF and the second ETF have different thermal time constants with different temperature dependencies. In particular, a thermal time constant of the ETF may be associated with the thermal diffusivity of one material (e.g., silicon) while the thermal time constant of the second ETF may be associated with another material (e.g., silicon dioxide). An output of the sensing component may then correspond to a difference in the temperature dependencies of these thermal time constants.

However, in some embodiments the parameter determined by the sensing component may be implicit, i.e., the parameter may be an indirect function of the temperature, and the sensing component may include a sensor other than the temperature sensor. For example, the sensing component may include a frequency-monitoring circuit and the parameter may include the fundamental frequency.

In some embodiments, the first signal is adjusted or modified based on one or more additional parameters other than a temperature-dependent parameter. For example, the first signal may be adjusted based on stress, doping or a geometry of the EFLL circuit (or an associated process monitor), thereby correcting the second signal for variations in the one or more additional parameters.

In some embodiments, the compensation for frequency changes associated with changes in the temperature is based at least on a predetermined relationship between the fundamental frequency and the temperature, such as that associated with a temperature dependent thermal diffusivity of the material in the ETF. Note that the compensation circuit may also compensate for the temperature dependence of other elements in the EFLL circuit. Note that the temperature dependence of the EFLL can also be compensated by adjusting the drive circuit to modify the phase of the second signal relative to the first signal.

In some embodiments, the EFLL circuit includes a storage component that stores a calibration setting or one or more trim settings associated with the EFLL circuit. For example, the storage component may include: a non-volatile memory, an array of resistors, a memory circuit and/or a fusable link. Note that the one or more settings may specify constant values, such as the coefficients of a polynomial that may be used to modify the output of the sensing component. This polynomial modification may be implemented in the digital domain. In some embodiments, the one or more settings consist of a single value.

In some embodiments, the EFLL circuit is implemented or disposed on a semiconductor die.

Another embodiment provides an electronic device that includes an integrated circuit that includes the EFLL circuit.

Another embodiment provides a second EFLL circuit that includes an ETF, which includes: a heater, electrically coupled to a digitally-controlled oscillator circuit, which receives a first analog electrical signal having a fundamental frequency; a thermal path, thermally coupled to the heater, which includes a material having a thermal diffusivity; and a temperature sensor, thermally coupled to the thermal path, which provides a second analog electrical signal that has the fundamental frequency and a phase difference relative to the first analog electrical signal, where the phase difference is associated with the thermal diffusivity of a material in the thermal path. Moreover, the second EFLL circuit may include a first conversion circuit, electrically coupled to the temperature sensor, which converts the phase difference to a first digital electrical signal. Furthermore, the second EFLL circuit may include a digital comparator, electrically coupled to the first conversion circuit and an input node. Note that the input node receives a digital phase reference signal, and the comparator provides a second digital electrical signal having a value proportional to the difference between the phase difference and the digital phase reference signal. Additionally, the digitally-controlled oscillator circuit, electrically coupled to the digital comparator and the heater, may generate the first analog electrical signal based on the second digital electrical signal.

In some embodiments of the first and/or the second EFLL circuit the phase difference is represented by an analog signal in an analog loop, and the oscillator circuit is controlled by an analog signal, e.g., a voltage or a current. Furthermore, the output frequency of the oscillator circuit may be divided (or multiplied) before it is applied to the ETF, which allows the fundamental frequency to be selected or adjusted.

Another embodiment provides a third EFLL circuit in which an analog feedback loop is temperature-compensated and used as a frequency reference. For example, this can be done by adding a temperature-dependent phase-shift either to the synchronous demodulator's reference signal or to the drive signal of the ETF.

Another embodiment provides a method for providing a first signal, which may be performed using a given EFLL circuit (such as the EFLL circuit, the second EFLL circuit or the third EFLL circuit). During operation, the drive circuit in the EFLL circuit generates a first signal. Then, the ETF in the EFLL circuit provides a second signal based on the first signal, where the second signal has the same fundamental frequency as the first signal and a relative phase shift corresponding to the temperature-dependent time constant of the ETF. Moreover, a sensing component in the EFLL circuit determines a parameter associated with the temperature of the ETF. Next, the compensation circuit in the EFLL circuit compensates for frequency changes associated with changes in the temperature based at least on the parameter so that the fundamental frequency of the first signal is approximately independent of the temperature.

BRIEF DESCRIPTION OF THE DRAWINGS

FIG. 1A is a block diagram of an analog electrothermal frequency-locked loop (EFLL) circuit in accordance with an embodiment.

FIG. 1B is a block diagram of a digitally-assisted EFLL circuit in accordance with an embodiment.

Figure 2:
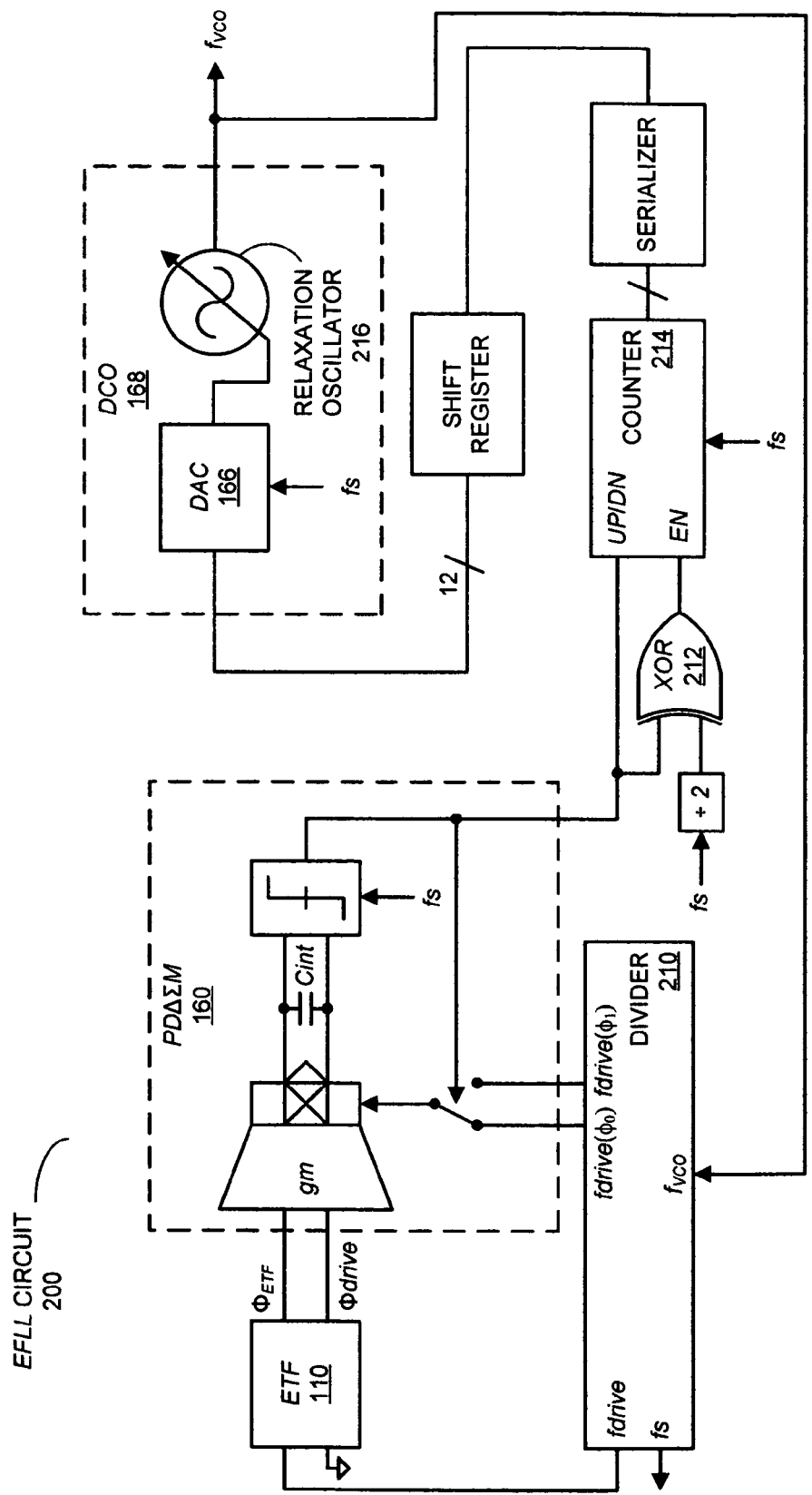
FIG. 2 is a block diagram of a digitally-assisted EFLL circuit in accordance with an embodiment.

Table 1 provides parameters and performance characteristics of several frequency references.

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Embodiments of an electrothermal frequency-locked loop (EFLL) circuit (which is sometimes referred to as a thermal diffusivity-based frequency reference), an electronic device that includes the EFLL circuit, and a method for providing a signal using the EFLL circuit are described. This EFLL circuit includes an oscillator or another signal generator in a feedback loop. A drive circuit in the EFLL circuit generates a first signal having a fundamental frequency, and an electrothermal filter (ETF) in the EFLL circuit provides a second signal based on the first signal. This second signal has the fundamental frequency (which is defined by the first signal) and a phase (relative to the first signal) that corresponds to a temperature-dependent time constant of the ETF. The drive circuit may monitor the phase and adjust the fundamental frequency so that the phase is maintained at a predetermined phase set-point, thereby locking the fundamental frequency to the thermal time constant of the ETF. In addition, a sensing component in the EFLL circuit determines a parameter associated with a temperature of the ETF. For example, the parameter may be the temperature or may be other than the temperature, such as the fundamental frequency and/or the phase of the second signal. Furthermore, the EFLL circuit includes a compensation circuit that compensates for frequency changes associated with changes in the temperature based at least on the parameter so that the fundamental frequency is approximately independent of the temperature.

Alternatively or additionally, in some embodiments at least a portion of the EFLL circuit is implemented in the digital domain so that the noise bandwidth of the circuit is defined by a digital filter instead of an analog filter.

By adjusting the EFLL circuit based at least on the parameter and/or by implementing at least a portion of the EFLL circuit in the digital domain, this generating technique can provide a stable on-chip frequency reference over a wide range of process and temperature variations. For example, by implementing the ETF in integrated-circuit-grade silicon (which has a well-defined thermal diffusivity) used as the substrate of a standard 0.7 µm CMOS process, a fundamental frequency of 1.6 MHz with an absolute inaccuracy (device-to-device spread) of ±0.1% from −55 to 125 C., and a temperature coefficient of ±11.2 ppm/C can be achieved, while dissipating 7.8 mW from a 5 V supply. Consequently, the EFLL circuit: may provide a fixed or adjustable frequency reference that is: more accurate than RC and ring oscillators; may dissipate less power than LC oscillators; and may scale well with process. Furthermore, this approach may eliminate the need for external components, such as capacitors, thereby facilitating full CMOS integration.

We now describe embodiments of an EFLL circuit. An integrated ETF typically includes a heater (e.g., an $n^+$ diffusion resistor) and a temperature sensor (e.g., a thermopile made of $p^+$/Al arms) realized in close proximity (such as with a separation s of 20 µm) on the same semiconductor substrate (such as silicon, which is henceforth used as an illustrative example). AC power dissipation in the heater leads to an AC temperature gradient in the substrate, which is sensed by the thermopile and converted into an electrical signal. Because of the substrate's thermal inertia, the phase of this signal lags that of the heater power. At a given frequency, the amount of phase shift $\phi_{ETF}$ is typically determined by the ETF's geometry and by the thermal diffusivity D of the bulk silicon. Moreover, at typical (low) substrate doping levels, D is approximately constant, and so the accuracy of $\phi_{ETF}$ is usually limited by the accuracy of the lithography.

The fundamental frequency of an output signal generated by an EFLL circuit that includes an ETF may be locked to the phase shift of the ETF. Because of the temperature dependence of the thermal diffusivity of silicon, the fundamental frequency is proportional to $1/T^n$, where T is the absolute temperature and n is approximately 1.8.

Note that silicon is a good thermal conductor, and the output of an ETF is usually quite small (sub-millivolt). Because this signal also includes thermal noise, the noise bandwidth of this type of EFLL circuit is typically very small (sub-Hz) in order to achieve reasonable jitter. For example, a jitter of less than 0.05% can be achieved with a noise bandwidth of 0.5 Hz.

FIG. 1A presents a block diagram of an analog EFLL circuit 100. In this EFLL circuit, a voltage-controlled oscillator (VCO) 116 (and, more generally, a drive circuit) drives ETF 110 and a synchronous demodulator 112 (such as a mixer) with a fraction of the VCO's output. This synchronous demodulator detects the phase of the ETF's output signal. Then, the output of synchronous demodulator 112 is integrated by an analog filter 114, which drives VCO 116. Note that the loop may lock when the synchronous demodulator's DC output is zero, which corresponds to a VCO frequency $f_{VCO}$ (and thus the fundamental frequency of the output signal) equal to $f_{90}$, at which point the phase shift $\phi_{ETF}$ of the first harmonic of the ETF's near-sinusoidal output is approximately 90°. The EFLL's phase-frequency characteristic is therefore locked to that of ETF 110.

FIG. 1B presents a block diagram of a digitally-assisted EFLL circuit 150. In addition to VCO 116 and ETF 110, this EFLL circuit includes: a digital phase detector (such as a phase-domain sigma-delta modulator or PDΔΣM 160), a digital filter 164 and/or a digital-to-analog converter 166 (DAC). VCO 116 drives ETF 110 (for example, with a continuous or a pulsed signal), and the phase shift $\phi_{ETF}$ may be digitized by PDΔΣM 160. Furthermore, the PDΔΣM's bitstream output may be compared with a phase reference $\phi_{REF}$ (such as 90°) using a comparison circuit 162, and the resulting error signal may be integrated by digital filter 164 and fed back, via DAC 166, to VCO 116 (which together may constitute a digitally controlled oscillator or DCO 168). The feedback may force VCO 116 to operate at $f_{VCO}$, such that $\phi_{ETF}$ equals $\phi_{REF}$. If $\phi_{REF}$ equals 90°, $f_{VCO}$ equals $f_{90}$. As noted previously, for a fixed $\phi_{REF}$, $f_{VCO}$ and the drive frequency ($f_{drive}$) at ETF 110 (which may be a fraction 1/N of $f_{VCO}$, or a multiple N of $f_{VCO}$, where N may be an integer) are proportional to $1/T^n$. Furthermore, note that PDΔΣM 160, digital filter 164, and DAC 166 may be sampled at the same frequency fs, which may be a sub-multiple (such as 1/M, where M may be an integer) of $f_{VCO}$.

The result is a self-referenced circuit that provides an output signal having a fundamental frequency ($f_{VCO}$) that is mostly determined by the properties of ETF 110, and which is largely unaffected by the tolerances of DCO 168. Furthermore, the noise bandwidth of EFLL circuit 150 may be determined by digital filter 164, and so can be almost arbitrarily low. Additionally, this architecture may facilitate full CMOS integration.

A more detailed version of the digitally-assisted EFLL circuit is shown in FIG. 2, which presents a block diagram of a digitally-assisted EFLL circuit 200. In this EFLL circuit, $f_{drive}$ (which drives ETF 110) may be a sub-multiple of $f_{VCO}$. Moreover, the output from ETF 110 may be converted into a current by a wideband transconductor gm in the front-end of PDΔΣM 160. Furthermore, an embedded chopper demodulator in PDΔΣM 160 may detect the phase of this current by multiplying it by one of two phase references, fdrive($\phi_0$) or fdrive($\phi_1$), which may be ±45° phase-shifted versions of fdrive. Note that while the resulting phase-difference current is dependent on the amplitude of the analog signal output by ETF 110, this amplitude is not important because the internal loop of the PDΔΣM (described below) drives this current to zero.

Next, the phase-difference current may be integrated by the PDΔΣM's loop filter Cint. The integrated output is applied to a comparator or 1-bit ADC which generates a bitstream output. This output is also used to select one of the two phase references, in such a way that the average value of the phase-difference current is driven to zero. Note that the PDΔΣM's bitstream output is then a digital representation of the ETF's phase shift $\phi_{ETF}$.

Moreover, the signals fdrive, fdrive($\phi_0$), fdrive($\phi_1$) and fs may all be derived or determined from $f_{VCO}$ by divider 210 In order to implement ±45° phase references with a 50% duty cycle, $f_{VCO}$ may equal 16fdrive. Additionally, the 90° phase reference may be a square-wave signal with a frequency of fs/2. This phase reference may be subtracted from the PDΔΣM bitstream output, and the resulting 3-level signal may be integrated by a 12-bit up/down counter 214. When the result is zero, XOR gate 212 may disable counter 214. Otherwise, the counter's state may be appropriately incremented or decremented. Furthermore, the output from counter 214 may be fed to a 12-bit DCO 168, which includes 12-bit DAC 166 and a VCO, such as relaxation oscillator 216. The non-linear relationship between the DCO's input code and the fundamental frequency ($f_{VCO}$) of the output signal may be compensated by the frequency-locked loop in EFLL circuit 200.

Note that the noise bandwidth of EFLL circuit 200 may be determined by the length of counter 214 and the value of fs. For example, for a 12-bit counter and fs equal to fdrive/64, the noise bandwidth at room temperature may be 0.5 Hz. Alternatively, for a 12-bit counter and fs equal to fdrive/256, the noise bandwidth at room temperature may be 0.125 Hz. This noise bandwidth may ensure sufficient suppression of the ETF's wide-band noise and the PDΔΣM's quantization noise.

In an exemplary embodiment, EFLL circuit 200 was implemented using a standard 0.7 µm CMOS process with a die area of 4 mm². ETF 110 dissipated 2.5 mW, while PDΔΣM 160 and 12-bit DCO 168 together dissipated 5 mW from a 5 V supply. Furthermore, because the frequency-locked loop was effectively dithered by the ETF's thermal noise (about 2 LSBs p-p), the DAC 166 does not have to be strictly monotonic, i.e., the magnitude of any errors in the step size associated with one least significant bit (LSB) do not have to be less than 1 LSB. Note that the DAC's LSB step size corresponded to a DCO increment of 890 Hz.

Additionally, the sampling rate of PDAEM 160 and DCO 168 was set to fdrive/32, which corresponds to a noise-bandwidth of 0.4 Hz. Furthermore, the jitter in fdrive (which equaled $f_{VCO}/16$) was about 100 Hz (rms), which corresponds to a jitter of 0.05% (rms). Measurements on sixteen samples or devices from one batch showed the expected $T^n$ dependency of fdrive. Note that the spread in the fundamental frequency of the output signal in untrimmed devices was about ±0.2% from −55 to 125° C. This level of accuracy is comparable to that of analog EFLL circuits, such as EFLL circuit 100 (FIG. 1A). However, EFLL circuit 100 (FIG. 1A) typically uses large external capacitors, while EFLL circuit 200 may not need these external components.

In another embodiment of the EFLL circuit, the temperature dependency of fdrive is at least in part compensated for by ensuring that $\phi_{REF}$ is proportional to $T^{n/2}$. (More generally, the temperature dependence of $\phi_{REF}$ may correspond to the temperature-dependence of the phase shift $\phi_{ETF}$, which in turn corresponds to the temperature dependence of the thermal diffusivity of the material in the substrate in the ETF.) For example, as described further below, in this EFLL circuit information associated with the die temperature may be provided by an on-chip band-gap temperature sensor.

Figure 3A:
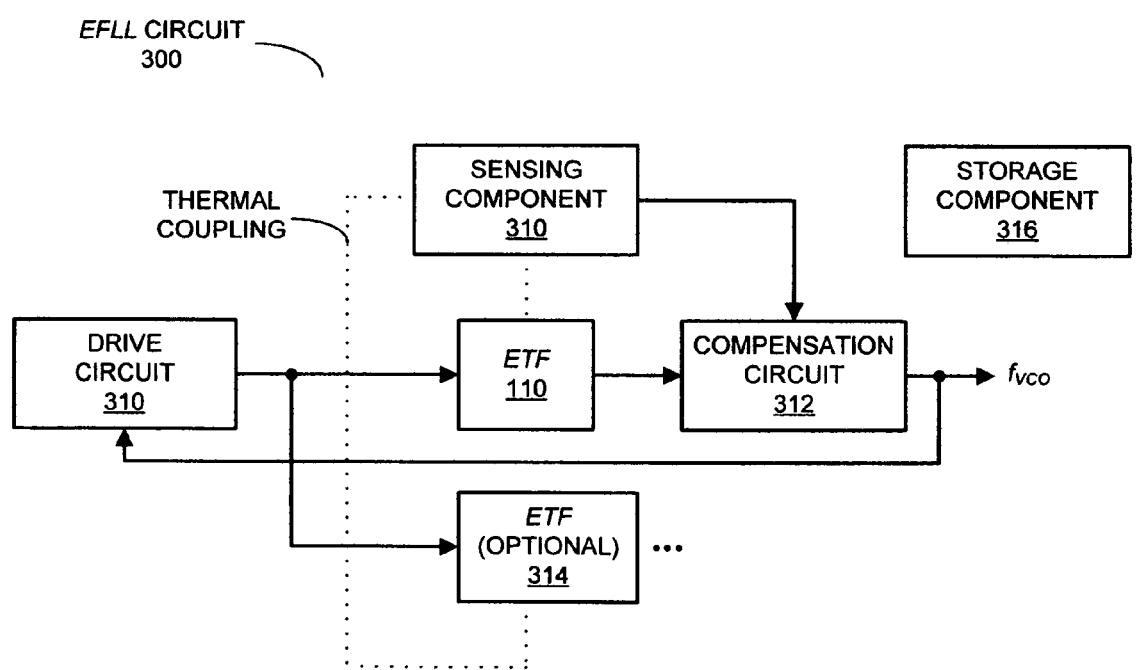
FIG. 3A is a block diagram of an EFLL circuit in accordance with an embodiment.

This EFLL circuit is illustrated abstractly in FIG. 3A, which presents a block diagram of an EFLL circuit 300. In this EFLL circuit, drive circuit generates a first (input) signal. This first signal is provided to ETF 110, which provides a second (output) signal. This second signal has the fundamental frequency and a phase that corresponds to a temperature-dependent time constant of ETF 110. Note that EFLL circuit 300 includes a feedback loop that ensures that the phase is maintained at a pre-determined phase set-point. A sensing component 310 determines a parameter associated with a temperature of ETF 110. Furthermore, a compensation circuit 312, electrically coupled to drive circuit 308 and sensing component 310, compensates for frequency changes associated with changes in the temperature based at least on the parameter so that the fundamental frequency is approximately independent of the temperature. For example, the compensation may be based at least on a predetermined relationship between the fundamental frequency and the temperature (such as a known temperature dependence of the thermal diffusivity of the material in the substrate in ETF 110). In some embodiments, compensation circuit 312 compensates for the temperature dependence by adjusting drive circuit 308 to modify the phase of the second signal.

Moreover, the sensed parameter may be a function of the temperature. This dependence may be explicit, i.e., the parameter may be the temperature, and sensing component 310 may include a temperature sensor that is thermally coupled to ETF 110. Note that the temperature sensor may be based upon a different physical phenomenon than the ETF. For example, as described further below with reference to FIG. 3B, the temperature sensor may be a band-gap temperature sensor. However, as known to one of skill in the art, a wide variety of temperature sensors may be used, such as a calibrated resistor or a metal-oxide-semiconductor field-effect transistor (MOSFET).

Furthermore, the temperature sensor may employ differential measurements involving at least one other ETF. For example, EFLL circuit 300 may include optional ETF 314 electrically coupled to drive circuit 308, where ETF 110 and optional ETF 314 have different thermal time constants with different temperature dependencies. In particular, a thermal time constant of ETF 110 may be associated with a semiconductor (such as a semiconductor in a thermal path), and a thermal time constant of optional ETF 314 may be associated with an oxide (such as an oxide in a thermal path). Note that an output of temperature sensor may correspond to a difference in the temperature dependencies of the thermal time constants of ETF 110 and optional ETF 314.

However, in some embodiments the dependence may be implicit, i.e., the parameter may be other than the temperature, and sensing component 310 may include a sensor other than the temperature sensor. For example, sensing component 310 may include a frequency-monitoring circuit, and the parameter may include the fundamental frequency and/or the phase of the second signal.

In some embodiments, EFLL circuit 300 includes a storage component 316 that stores a calibration setting or one or more trim settings associated with EFLL circuit 300. (Note that the calibration setting may include values derived by comparing the output of the EFLL with a reference, and the trim settings may include values that describe adjustments to the circuit so as to reduce errors. In the discussion, the meaning of 'calibration setting' is broadened to encompass trim settings.) For example, storage component 316 may include: a non-volatile memory, an array of resistors, a memory circuit and/or a fusable link. Note that the calibration settings may specify constant values, such as coefficients of a polynomial that may be used to modify the output of sensing component 310, thereby specifying a gain of this output and/or calibrating sensing component 310. This polynomial may be implemented in the digital domain. In some embodiments, the calibration setting includes a single value.

In some embodiments, EFLL circuit 300 is implemented or disposed on a semiconductor die (which is sometimes referred to as a 'chip' or an integrated circuit) without external passive components. Note that a phase set point of EFLL circuit 300 (as well as previous embodiments of the EFLL circuit) may be adjustable. For example, the phase set point of EFLL circuit 300 may be continuously adjustable.

Figure 3B:
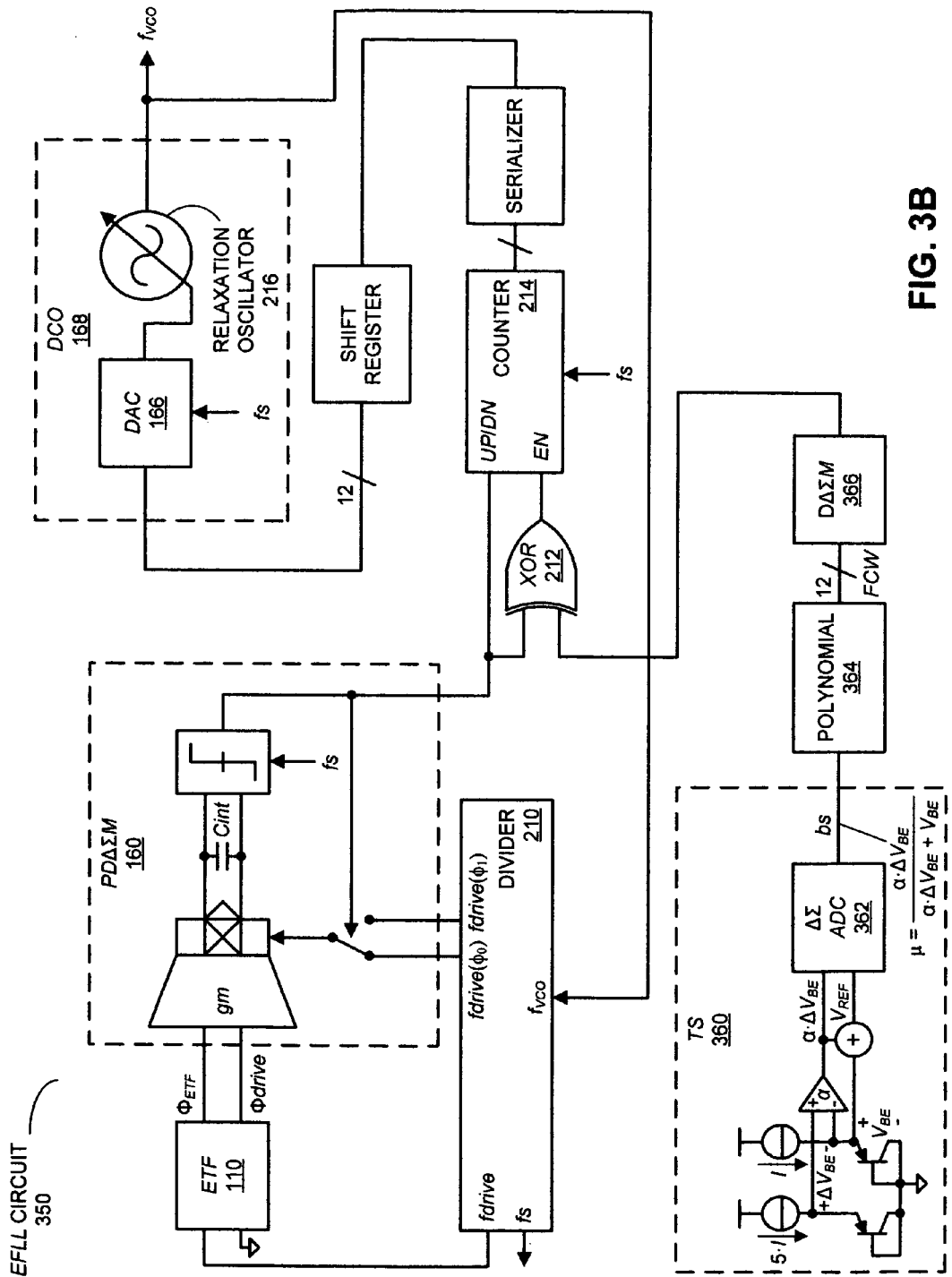
FIG. 3B is a block diagram of an EFLL circuit in accordance with an embodiment.

A more detailed version of the EFLL circuit is shown in FIG. 3B, which presents a block diagram of an EFLL circuit 350. This EFLL circuit includes a frequency-locked loop (FLL) and a temperature sensor (TS) 360, such as a band-gap temperature sensor. Moreover, the FLL includes: ETF 110, PDΔΣM 160 that digitizes $\phi_{ETF}$, a 12-bit DCO 168, up/down counter 214, and a second-order digital ΔΣ modulator (DΔΣM) 366 that generates $\phi_{REF}$, which corresponds to a 12-bit frequency control word (FCW). Note that TS 360 may include two temperature-sensing substrate PNPs and a second-order ΔΣ analog-to-digital converter (ADC) 362. As known to one of skill in the art, a variety of techniques may be used to translate the digital output of TS 360 into the FCW that corresponds to a target fundamental frequency, such as 1.6 MHz. For example, a polynomial 364 (such as a fifth-order polynomial) may be used. Alternatively or additionally, a look-up table, a cubic spline and/or an interpolation technique may be used.

As in EFLL circuit 200 (FIG. 2B), ETF 110 may be driven by fdrive equal to $f_{VCO}/16$, for example, $f_{VCO}$ may equal 1.6 MHz and fdrive may equal 100 kHz. The output of ETF 110 may be applied to the front end of PDΔΣM 160. Furthermore, the output current from the front end in PDΔΣM 160 may be multiplied by one of two ±45° phase-shifted versions of fdrive. The DC component of the resulting current (which is proportional to the phase difference) may be integrated by Cint. Note that the PDΔΣM's bitstream output is then a digital representation of $\phi_{ETF}$.

Additionally, XOR gate 212 compares the bitstream outputs of DΔΣM 366 and PDΔΣM 160. When they are equal, the 12-bit up/down counter 214 is disabled. Otherwise its state is appropriately incremented or decremented. Note that counter 214 acts as a digital integrator that drives DCO 168 to the frequency at which the digitized $\phi_{ETF}$ equals the frequency corresponding to the FCW. In some embodiments, DCO 168 includes a 12-bit segmented current-steering DAC 166 that tunes relaxation oscillator 216.

Figure 4:
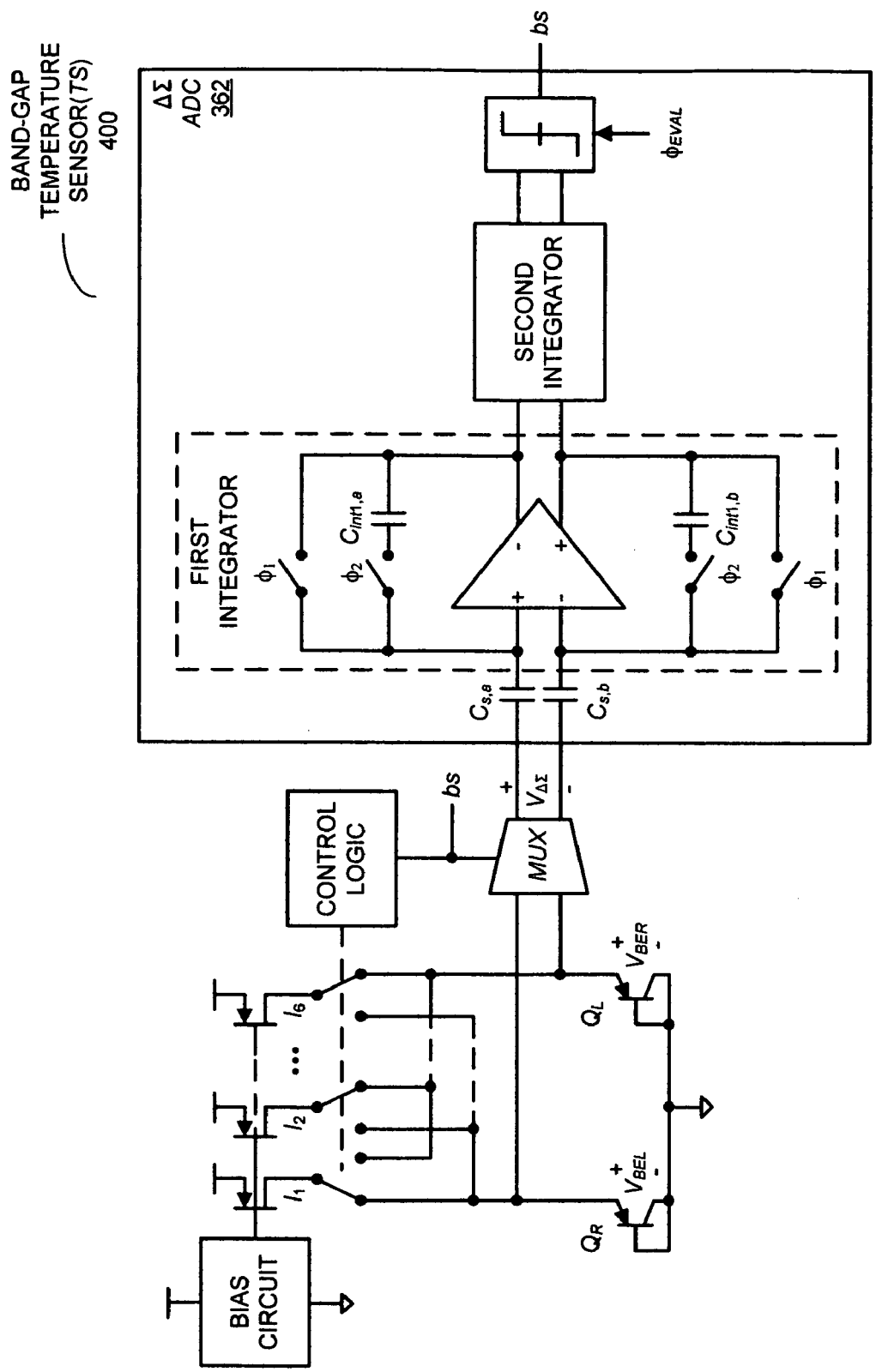
FIG. 4 is a block diagram of a band-gap temperature sensor in accordance with an embodiment.
Figure 5:
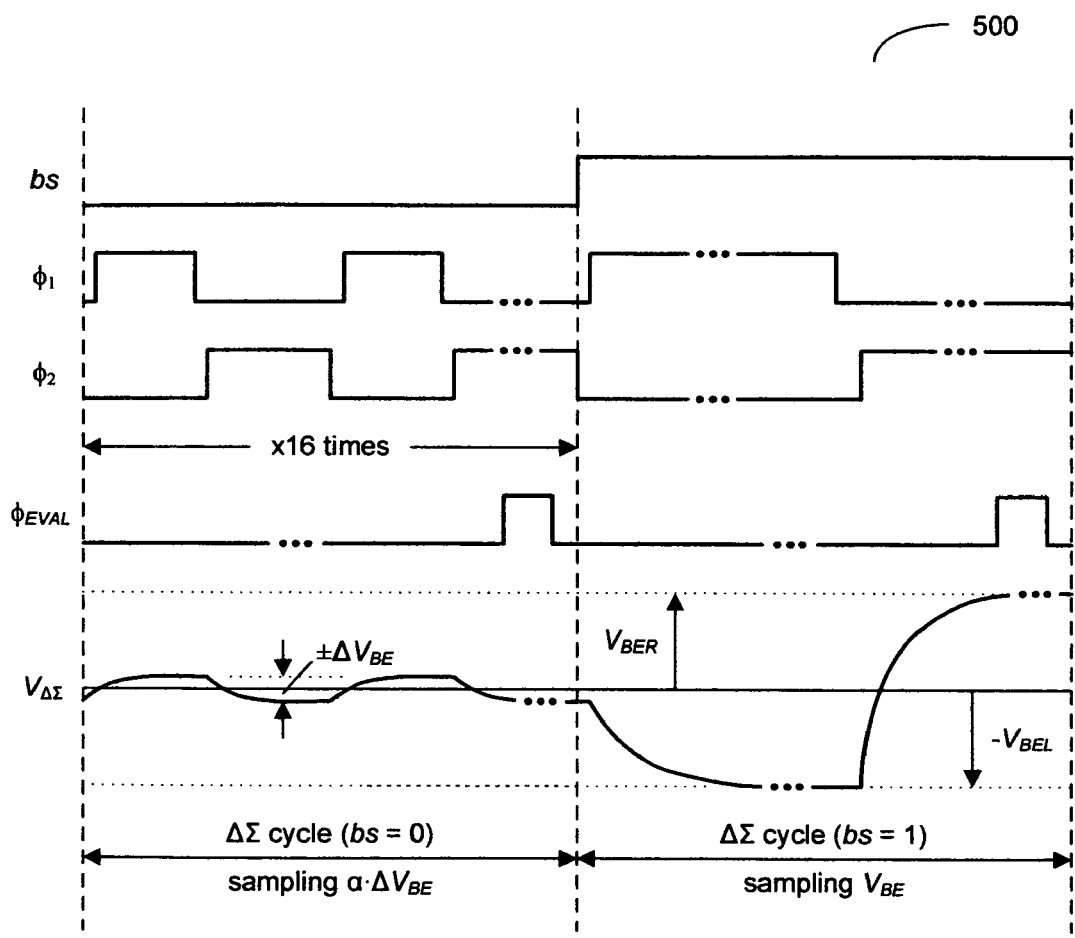
FIG. 5 is a timing diagram of transient waveforms associated with the band-gap temperature sensor of FIG. 4 during two consecutive sigma-delta ($\Delta\Sigma$) cycles in accordance with an embodiment.

As noted previously, in some embodiments TS 360 is based on two substrate PNPs biased at a 5:1 current ratio. The difference between their base-emitter voltages, $\Delta V_{BE}$ (a proportional-to-absolute-temperature or PTAT voltage) may be multiplied by a gain factor (such as α equal to 16) and combined with a $V_{BE}$ to realize the band-gap reference voltage of second-order ΔΣ ADC 362, which digitizes $\Delta V_{BE}$. As shown in FIG. 4, which presents a block diagram of a band-gap temperature sensor (TS) 400, when the ΔΣ ADC's bitstream bs equals 0, a set of 6 current sources may generate $\Delta V_{BE}$ by biasing $Q_L$ and $Q_R$ at a dynamically matched ratio of 5:1. A multiplexer (MUX) feeds this to the sampling capacitors of the first integrator in ΔΣ ADC 362, where it is sampled during phase $\phi_1$ and integrated during phase $\phi_2$. Furthermore, when bs equals 1, either $V_{BEL}$ or $V_{BER}$ are integrated. Note that instead of implementing a gain factor α equal to 16 by sampling $\Delta V_{BE}$ twice on eight sampling capacitors, in band-gap temperature sensor (TS) 400 it may be implemented by sampling $\Delta V_{BE}$ sixteen times on a single capacitor. This approach may eliminate the need to use dynamic element matching for a precise 1:8 capacitor ratio, which, in turn, may result in simpler logic and a 30% reduction in the area of band-gap temperature sensor (TS) 400. FIG. 5 presents a timing diagram 500 of transient waveforms associated with band-gap temperature sensor (TS) 400 (FIG. 4) during two consecutive ΔΣ cycles.

Referring back to FIG. 3B, in an exemplary embodiment EFLL circuit 350 was implemented using a standard 0.7 μm CMOS process with a die area of 6.75 mm². This EFLL circuit dissipated 7.8 mW from a 5V supply. Furthermore, the compensation polynomial 364 used to translate the digital output of TS 360 into the FCW was extracted by batch calibrating sixteen samples or devices from the same batch over temperature. TS 360 was operated at a conversion rate of 2 Hz, which is in line with the 0.5 Hz noise bandwidth of EFLL circuit 350. Note that the spread in the PNPs' saturation current was compensated by a single PTAT trim. Because the ETF's spread is also PTAT in nature, both these sources of spread were compensated for by the same trimming knob. (In particular, two PTAT error sources, one in ETF 110 and the other in TS 360 were simultaneously trimmed via one knob in TS 360, and the result was applied to EFLL circuit 350.) Additionally, because the temperature coefficient of EFLL circuit 350 was ±11.2 ppm/C, its temperature did not need to be stable during trimming, which greatly simplified the process. Measurements of sixteen samples or devices from the same batch show that the untrimmed frequency reference of 1.6 MHz achieved an absolute inaccuracy (device-to-device spread) of only ±0.2% over the military range (−55 C. to 125 C.). After trimming at room temperature, it achieved an absolute inaccuracy of ±0.1% with (σ equal to ±0.05%).

As shown in Table 1, the parameters and performance of EFLL circuit 350 compares favorably with those of other frequency references.

TABLE 1

|  | LC | Ring Oscillator | RC | EFLL Circuit |
|---|---|---|---|---|
| Frequency (MHz) | 12 | 7.03 | 6 | 1.6 |
| Supply Voltage (V) | 3.3 | 2.5 | 1.2 | 5 |
| Power Consumption (mW) | 31 | 1.5 | 0.066 | 7.8 |
| Technology (μm) | 0.35 | 0.25 | 0.065 | 0.7 |
| Temperature Range (C.) | −10~85 | −40~125 | 0~120 | −55~125 |
| Inaccuracy (%) | ±0.04 | ±1.84 | ±0.9 | ±0.1 |
| Number of Samples | 1 | 94 | 4 | 16 |
| Period Jitter (rms) | 0.008% | NA | NA | 0.05% |
| Temperature Coefficient (ppm/C.) | 8.1 | ±50.9 | 86.1 | ±7.8 |

In scaled CMOS, the accuracy of EFLL circuit 350 may be ultimately limited by inaccuracy of TS 360 to 150 ppm (1σ), which makes it suitable for applications such as Universal Serial Bus. Furthermore, the well-defined temperature behavior of ETF 110 enables single-temperature trimming (as opposed to a multi-temperature trim). Additionally, the reduced dimensions of a scaled ETF increase its output signal, thus enabling further reductions in heater power.

We now further describe the analog components in embodiments of the EFLL circuit. The main analog blocks of the digitally-assisted EFLL circuit may include: ETF 110, the PDΔΣM 160 and/or DCO 168 (which may include DAC 166 and the VCO, for example, a 12-bit DAC that drives relaxation oscillator 216).

As noted previously, the function of PDΔΣM 160 is to accurately digitize the ETF's phase shift $\phi_{ETF}$. Potential sources of error include excess electrical phase shift and residual offset. In some embodiments, ETF 110 was designed to have an $f_{90}$ of about 100 kHz at room temperature, and a lithography-limited phase spread of 0.12° □ (3σ) in a 0.7 μm process. This may lead to a temperature sensing inaccuracy of 0.5° C. over the military temperature range (−55 to 125° C.). Furthermore, as noted in the discussion of FIG. 2, PDΔΣM 160 may include a transconductor gm and an embedded chopper demodulator. In some embodiments, the transconductor has a simulated bandwidth of 115 MHz and contributes less than 0.01° □ of additional phase shift at 100 kHz. This corresponds to an output frequency error of less than 0.04%. Additionally, errors due to residual offset may be minimized by chopping the entire front-end. Note that the combination of ETF 110 and PDΔΣM 160 may provide a temperature sensing inaccuracy of 0.7° C. (3σ) and a resolution of 0.05° C. in a bandwidth of 0.5 Hz.

Figure 6:
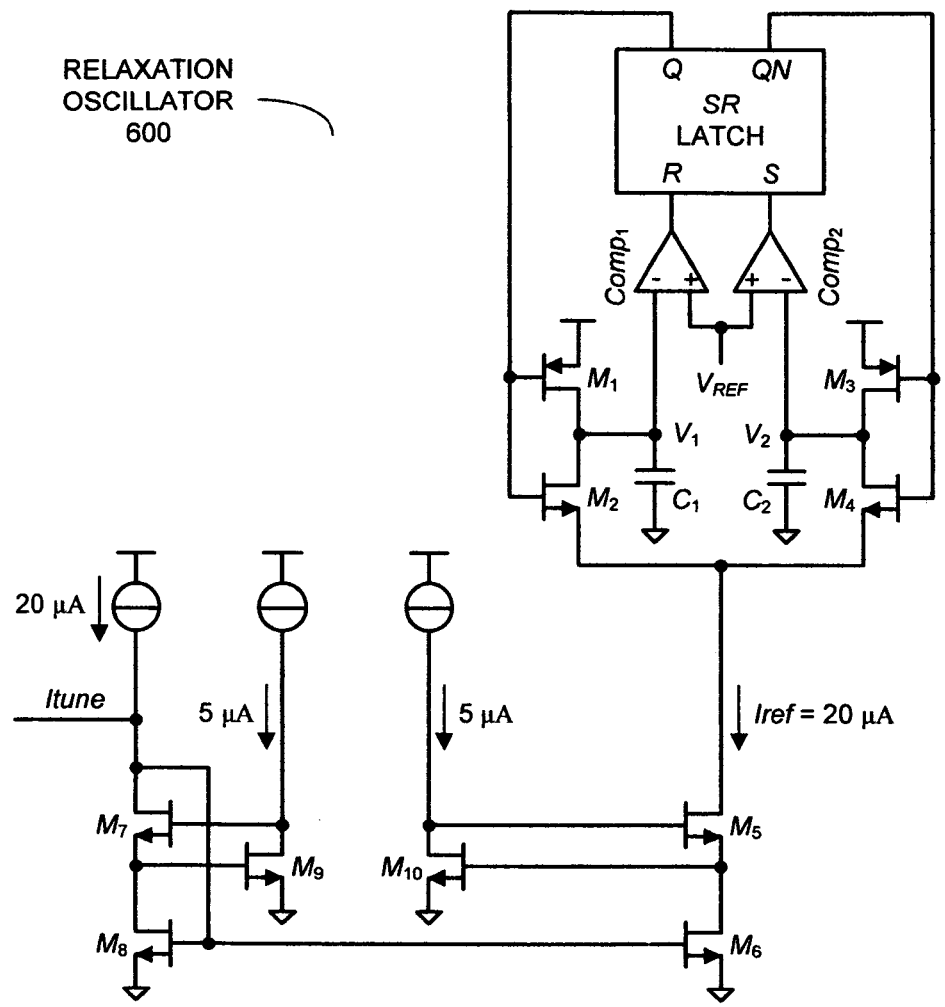
FIG. 6 is a block diagram of a relaxation oscillator in accordance with an embodiment.

FIG. 6 presents a block diagram of a relaxation oscillator 600, such as relaxation oscillator 216 (FIGS. 2 and 3B). At room temperature, this relaxation oscillator's frequency $f_{VCO}$ may be at 16fdrive, or about 1.6 MHz. In addition, $f_{VCO}$ may be tunable over the range 0.8 to 3.2 MHz, which corresponds to the expected variation of the fundamental frequency of the output signal over the military temperature range. Note that the jitter of relaxation oscillator 600 typically is a major component of the EFLL circuit's output jitter and, thus, may limit the EFLL circuit's temperature sensing resolution.

Figure 7:
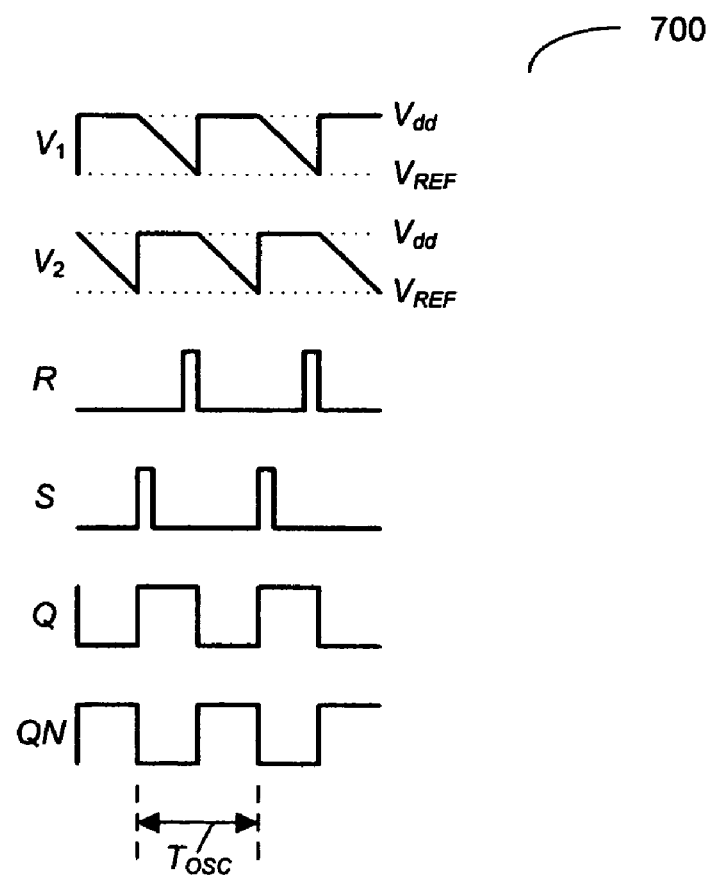
FIG. 7 is a timing diagram of transient waveforms associated with the relaxation oscillator of FIG. 6 in accordance with an embodiment.

FIG. 7 presents a timing diagram 700 of transient waveforms associated with relaxation oscillator 600 (FIG. 6). Depending on the state of the SR latch, either capacitor $C_1$ or $C_2$ is charged to Vdd by transistor $M_1$ or $M_3$, respectively, while the other capacitor is gradually discharged by Iref via transistor $M_2$ or $M_4$. Note that Iref may be provided by the cascode current mirror including transistors $M_5$-$M_8$. When the voltage over the capacitors reaches Vref, comparators $Comp_1$ and $Comp_2$ may feed the SR latch with the appropriate set or reset pulses, which then may toggle after a short delay td (such as approximately 100 ns). Then, the period of oscillation ($T_{OSC}$) is $$\frac{2 \cdot C \cdot (Vdd - Vref)}{Iref} + td,$$

where C, $C_1$ and $C_2$ may all equal 1 pF. For Iref equal to 20 µA, Vdd equal to 5 V, and Vref equal to 2.25 V, the center frequency is 2.6 MHz. To vary this frequency, the reference current may be varied by pushing or pulling a current Itune into the current mirror (the drain of transistor $M_7$). This current may be provided by DAC 166 (FIGS. 1B, 2 and 3B) and may be between ±18 µA, which corresponds to a tuning range from 0.35 to 4 MHz. This range may be wide enough to accommodate the EFLL circuit's expected frequency range plus the ±40% variation in center frequency due to process and temperature variations.

Note that the cascode transistors $M_5$ and $M_7$ may be gain-boosted by transistors $M_9$ and $M_{10}$. This may ensure that the mirror ratio is well defined despite the voltage excursions on $C_1$ and $C_2$, and the variation of Itune. Furthermore, the comparators $Comp_1$ and $Comp_2$ may include positive feedback latches with 50 mV of hysteresis, preceded by preamplifiers to minimize the effect of their 'kickback.' In relaxation oscillator 600 (FIG. 6), a major cause of jitter may be the input referred noise of the comparators. Over process corners and temperature, their maximum input-referred noise may be 140 µV (rms), which translates to 50 ppm of jitter at an oscillation frequency of 1.6 MHz.

Figure 8:
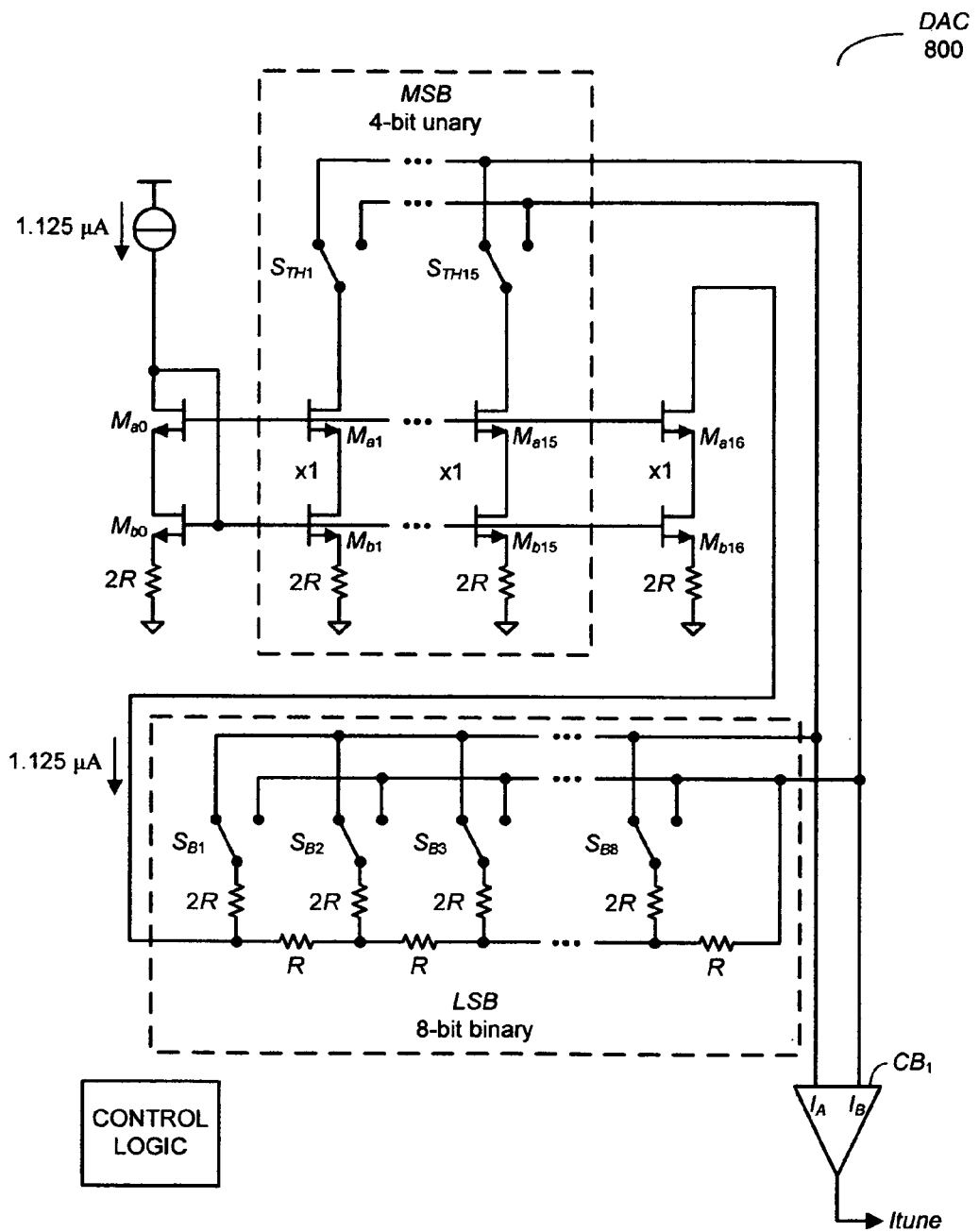
FIG. 8 is a block diagram of a digital-to-analog converter (DAC) in accordance with an embodiment.

FIG. 8 presents a block diagram of a DAC 800, such as DAC 166 (FIGS. 1B, 2 and 3B). (Note that while FIG. 8 illustrates a particular DAC embodiment, a wide variety of DACs may be used, as is known to one of skill in the art.) This DAC may provide the tuning current, Itune, for relaxation oscillator 216 (FIGS. 2B and 3B). In embodiments where the EFLL circuit's expected accuracy is about 0.25%, DCO 168 (FIGS. 1B, 2, and 3B) may have a resolution of 0.05% over the EFLL circuit's expected frequency range. To accomplish this, a 12-bit DAC, whose LSB corresponds to an 800 Hz step in $f_{VCO}$ may be used. Because the DAC is in a control loop, it is typically monotonic. Therefore, the segmented architecture shown in FIG. 8 may be used. In this architecture, the 4 most-significant bits (MSBs) may be implemented using 15 unary current sources, while the 8 LSBs may be implemented using an R-2R ladder network.

In some embodiments, the DAC's reference current is 1.125 µA, which may be copied fifteen times by current sources $M_{a,b1-15}$ that are degenerated by resistors with a value of 2R. Then, the output current of the unary cell may be selected by switches $STH_{1-15}$, which may be driven by a thermometer-code representation of the four MSBs (for example, the control logic may provide the four MSBs). An extra copy of the reference current may be copied by $M_{a,b16}$ to provide a 1.125 µA reference for the R-2R network (e.g., with R equal to 80 kΩ). This current may be divided into binary-weighted currents and may be selected by binary switches $SB_{1-8}$ driven by the eight LSBs (for example, the control logic may provide the eight LSBs). Note that the output currents of the unary and binary sections may be added in a differential-to-single-ended current buffer ($CB_1$), which may provide the relaxation oscillator's tuning current Itune. For a monotonic characteristic, the matching between the reference current sources $M_{a,b16}$ and the unary sources may be better than 8-bits (0.4%). Therefore, the current sources may be laid out in a common centroid manner. Furthermore, the R-2R network resistors may also be laid out in close proximity to the degeneration resistors. The input-referred offset of $CB_1$ may produce an offset current on the R-2R network, which may be less than the current corresponding to one LSB. This may translate into a worst-case input referred offset of 2 mV, which may be targeted by proper sizing and careful layout.

Figure 9:
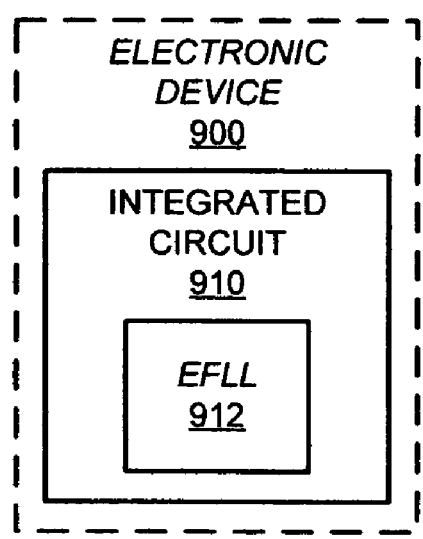
FIG. 9 is a block diagram of an electronic device in accordance with an embodiment.

The preceding embodiments of the EFLL circuit may be used in a wide variety of applications, including: intra-chip communication, inter-chip communication, an on-chip frequency reference, a clock source for use in one or more time domains, a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, a portable electronic device (such as a personal digital assistant, an MP3 player and a cellular telephone) and/or a non-portable electronic device. As a general illustration, FIG. 9 presents a block diagram of an electronic device 900, which includes an integrated circuit 910 that includes the EFLL circuit 912.

While the present disclosure has been described in connection with specific embodiments, the claims are not limited to what is shown. Consequently, EFLL circuit 100 (FIG. 1A), EFLL circuit 150 (FIG. 1B), EFLL circuit 200 (FIG. 2), EFLL circuit 300 (FIG. 3A), EFLL circuit 350 (FIG. 3B), band-gap temperature sensor (TS) 400 (FIG. 4), relaxation oscillator 600 (FIG. 6), DAC 800 (FIG. 8) and/or electronic device 900 (FIG. 9) may include fewer components or additional components. For example, the EFLL circuit may include two ETFs. One ETF may have a small spacing or separation for maximum signal (and, thus, low jitter), but may therefore be relatively sensitive to lithographic errors. The other ETF may be larger for maximum accuracy. During a factory calibration, the two ETFs may be alternately used in the EFLL circuit. Because the two ETFs are on the same die and at the same temperature, the relationship between their outputs may be fixed by the differences in the actual geometry of the two ETFs. Based on this calibration (which may be stored in a storage component associated with the EFLL circuit), the frequency of the EFLL circuit when coupled to the small ETF can be trimmed to the accuracy of the larger ETF. In this way, a small ETF can be used in the EFLL circuit while retaining the accuracy of a large ETF. This configuration may reduce the jitter (and, thus, the power dissipation) in the EFLL circuit by an order of magnitude relative to an EFLL circuit that has one ETF.

Alternatively or additionally, the first signal output by the drive circuit may be adjusted or modified based on one or more additional parameters other than a temperature-dependent parameter. For example, the first signal may be adjusted based on stress, doping or a geometry of the EFLL circuit (or an associated process monitor), thereby correcting the second signal for variations in the one or more additional parameters.

In some embodiments, the ETF is scaled to reduce the thermal delay (for example, by reducing the length of the thermal path between the heater and the temperature sensor of the ETF, and thus decreasing the thermal delay in the ETF and increasing the output frequency of the EFLL circuit), thereby increasing the output frequency of the EFLL circuit. Furthermore, in some embodiments, the geometry of the ETF is changed in order to modify the performance of the frequency reference.

Moreover, two or more components in one or more of the preceding embodiments may be combined into a single component and/or a position of one or more components may be changed.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art, for example, AC coupling and/or DC coupling may be used.

In some embodiments, functionality in these circuits, components and devices is implemented in hardware and/or in software as is known in the art. For example, some or all of the functionality of these embodiments may be implemented in one or more: application-specific integrated circuit (ASICs), field-programmable gate array (FPGAs), and/or one or more digital signal processors (DSPs). Furthermore, the circuits and components may be implemented using bipolar, PMOS and/or NMOS gates or transistors, and signals in these embodiments may include digital signals that have approximately discrete values and/or analog signals that have continuous values. Thus, the first signal generated by drive circuit 308 (FIG. 3A) may be a continuous signal or a pulsed signal (such as a signal with pulses at edges that correspond to the fundamental frequency). Additionally, components and circuits, such as the wideband transconductor gm in the front-end of PDΔΣM 160 (FIGS. 2 and 3B), may be single-ended or differential, and power supplies may be unipolar or bipolar.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 10:
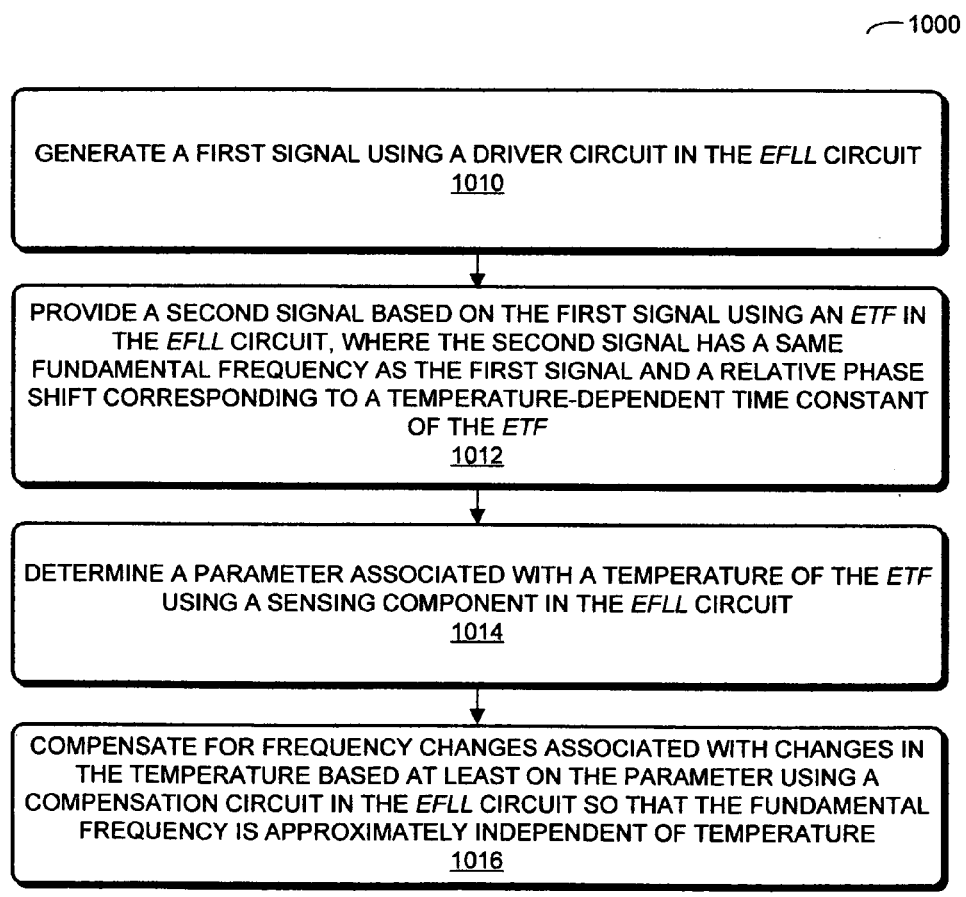
FIG. 10 is a flow chart illustrating a process for providing a signal in accordance with an embodiment.

We now describe embodiments of a process for providing the signal. FIG. 10 presents a flow chart illustrating a process 1000 for providing a signal, which may be performed using one of the preceding embodiments of the EFLL circuit. During operation, the drive circuit in the EFLL circuit generates a first signal (operation 1010). Then, the ETF in the EFLL circuit provides a second signal based on the first signal, where the second signal has the same fundamental frequency as the first signal and a relative phase shift corresponding to the temperature-dependent time constant of the ETF (operation 1012). Moreover, a sensing component in the EFLL circuit determines a parameter associated with the temperature of the ETF (operation 1014). Next, the compensation circuit in the EFLL circuit compensates for frequency changes associated with changes in the temperature based at least on the parameter so that the fundamental frequency is approximately independent of the temperature (operation 1016).

In some embodiments, process 1000 includes additional or fewer operations. Moreover, the order of the operations may be changed and/or two or more operations may be combined into a single operation.

While the preceding embodiments of the EFLL circuit represent the phase difference in the digital domain, in other embodiments the phase difference is represented by an analog signal in an analog loop, and the digitally-controlled oscillator circuit is either voltage or current controlled. Thus, while the implementation of the frequency reference has been illustrated with embodiments based on a digitally-assisted EFLL circuit, the analog loop of FIG. 1A can be temperature-compensated and used as a frequency reference. For example, this can be done by adding a temperature-dependent phase-shift either to the synchronous demodulator's reference signal or to the drive signal of the ETF. This approach may provide a simpler implementation of the frequency reference.

Moreover, while the preceding embodiments of the EFLL circuit output an approximately fixed fundamental frequency, in other embodiments the fundamental frequency output by the EFLL circuit is adjustable or selectable. For example, the output of the digitally-controlled oscillator circuit may be digitally divided (or multiplied) before it is applied to the ETF. Thus, the fundamental frequency may be adjusted continuously over one or more ranges. Alternatively or additionally, the fundamental frequency may be selected from a predefined set of discrete values. In some embodiments, an array of EFLL circuits is used to provide the predefined set of discrete values, which each may be fixed or which may be adjustable over an associated range of frequencies.

Furthermore, while the implementation of the ETF in the preceding embodiments was illustrated using a semiconductor substrate (such as silicon), a wide variety of materials with a temperature-dependent thermal diffusivity (such as a ceramic or a plastic) can be used in other embodiments. Alternatively or additionally, the underlying principle of the temperature-compensated EFLL circuit may be applied to other physical phenomenon in addition to or separate from the temperature-dependent thermal diffusivity of the material in the ETF. For example, using a suitable plastic substrate, hydroscopic effects (such as those associated with relative-humidity changes) or adhesion of a chemical (such as a gas or a compound that reacts with the material) may be used to modify the thermal diffusivity of the material in the ETF in a predefined or predetermined manner, which can form the basis of closed-loop compensated EFLL circuit and, thus, a sensor for the other physical phenomenon.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. Therefore, the spirit and scope of the appended claims should not be limited to the foregoing description. Only those claims specifically reciting "means for" or "step for" should be construed in the manner required under the sixth paragraph of 35 U.S.C. §112.

What is claimed:

1. An electrothermal frequency-locked-loop (EFLL) circuit, comprising:
 a drive circuit to generate a first signal having a fundamental frequency;

an electrothermal filter (ETF), electrically coupled to the drive circuit, the ETF having a temperature-dependent time constant, wherein the ETF provides a second signal having the fundamental frequency and a phase relative to the first signal corresponding to the time constant;

a sensing component to determine a parameter associated with a temperature of the ETF; and a compensation circuit, electrically coupled to the drive circuit and the sensing component, to compensate for frequency changes associated with changes in the temperature based at least on the parameter so that the fundamental frequency is approximately independent of the temperature.

2. The EFLL circuit of claim 1, wherein the sensing component includes a temperature sensor that is thermally coupled to the ETF; and wherein the parameter is the temperature.

3. The EFLL circuit of claim 2, wherein the temperature sensor is based upon a different physical phenomenon than the ETF.

4. The EFLL circuit of claim 2, wherein the temperature sensor includes a differential temperature sensor;

wherein the EFLL circuit further includes a second ETF electrically coupled to the drive circuit;

wherein the ETF and the second ETF have different thermal time constants with different temperature dependencies; and wherein an output of the temperature sensor corresponds to a difference in the thermal time constants of the ETF and the second ETF.

5. The EFLL circuit of claim 4, wherein a thermal time constant of the ETF is associated with a first material, and a thermal time constant of the second ETF is associated with a second material.

6. The EFLL circuit of claim 1, wherein the parameter is a function of the temperature.

7. The EFLL circuit of claim 1, wherein the sensing component includes a sensor other than a temperature sensor and the parameter is other than the temperature.

8. The EFLL circuit of claim 1, wherein the sensing component includes a frequency-monitoring circuit and the parameter includes the fundamental frequency.

9. The EFLL circuit of claim 1, wherein the compensation for frequency changes associated with changes in the temperature is based at least on a predetermined relationship between the fundamental frequency and the temperature.

10. The EFLL circuit of claim 1, wherein the compensation circuit adjusts the drive circuit to modify the phase of the second signal.

11. The EFLL circuit of claim 1, wherein the ETF is included in a feedback loop; and wherein the feedback loop is configured as a frequency-locked loop or a phase-locked loop.

12. The EFLL circuit of claim 1, further comprising a storage component to store a calibration setting of the electrothermal frequency-locked circuit.

13. The EFLL circuit of claim 12, wherein the calibration setting specifies a gain of an output of the sensing component.

14. The EFLL circuit of claim 12, wherein the calibration setting specifies one or more coefficients of a polynomial that is used to modify the output of the sensing component; and wherein the polynomial is implemented in a digital domain.

15. The EFLL circuit of claim 12, wherein the calibration setting calibrates the sensing component.

16. The EFLL circuit of claim 1, wherein the EFLL circuit is implemented on a semiconductor die without external passive components.

17. The EFLL circuit of claim 1, wherein the parameter is the phase; and wherein the compensation circuit adjust the first signal so that the phase of the second signal is maintained at a predetermined phase set-point, thereby locking the fundamental frequency to the time constant of the ETF.

18. The EFLL circuit of claim 1, wherein a phase set point of the EFLL circuit is adjustable.

19. An EFLL circuit, comprising:
an ETF, which includes:
a heater, electrically coupled to a digitally-controlled oscillator circuit, to receive a first analog electrical signal having a fundamental frequency;
a thermal path, thermally coupled to the heater, which includes a material having a thermal diffusivity; and
a temperature sensor, thermally coupled to the thermal path, to provide a second analog electrical signal that has the fundamental frequency and a phase difference relative to the first analog electrical signal, wherein the phase difference is associated with the thermal diffusivity of a material in the thermal path;

a first conversion circuit, electrically coupled to the temperature sensor, to convert the phase difference to a first digital electrical signal;

a digital comparator, electrically coupled to the first conversion circuit and an input node, wherein the input node is to receive a digital phase reference signal, and wherein the comparator is to provide a second digital electrical signal having a value proportional to the difference between the phase difference and the digital phase reference signal; and the digitally-controlled oscillator circuit, electrically coupled to the digital comparator and the heater, to generate the first analog electrical signal based on the second digital electrical signal.

20. A method for providing a second signal, comprising:
generating, via a drive circuit in an EFLL circuit, a first signal having a fundamental frequency;

providing, via an ETF in the EFLL circuit, the second signal based on the first signal, wherein the second signal has the fundamental frequency and a phase shift relative to the first signal corresponding to a temperature-dependent time constant of the ETF;

determining, via a sensing component in the EFLL circuit, a parameter associated with a temperature of the ETF; and compensating, via a compensation circuit in the EFLL circuit, for frequency changes associated with changes in the temperature based at least on the parameter so that the fundamental frequency is approximately independent of the temperature.

* * * * *